United States Patent [19]

Tepman et al.

[11] Patent Number: 5,228,501
[45] Date of Patent: Jul. 20, 1993

[54] PHYSICAL VAPOR DEPOSITION CLAMPING MECHANISM AND HEATER/COOLER

[75] Inventors: Avi Tepman, Cupertino; Howard Grunes, Santa Cruz; Dana Andrews, Mountain View, all of Calif.

[73] Assignee: Applied Materials, Inc., Santa Clara, Calif.

[21] Appl. No.: 939,542

[22] Filed: Sep. 2, 1992

Related U.S. Application Data

[63] Continuation of Ser. No. 513,318, Apr. 20, 1990, abandoned, and a continuation-in-part of Ser. No. 760,848, Sep. 17, 1991, which is a continuation of Ser. No. 595,793, Oct. 9, 1990, abandoned, which is a continuation of Ser. No. 411,189, Sep. 20, 1989, abandoned, which is a continuation of Ser. No. 343,035, Apr. 25, 1989, abandoned, which is a continuation of Ser. No. 185,215, Apr. 25, 1988, abandoned, which is a continuation-in-part of Ser. No. 147,594, Jan. 22, 1988, Pat. No. 4,842,683, which is a continuation of Ser. No. 944,843, Dec. 19, 1986, abandoned.

[51] Int. Cl.⁵ .............................. F28F 7/00
[52] U.S. Cl. .................. 165/80.1; 29/25.01; 118/69; 118/728
[58] Field of Search ............ 29/25.1; 118/500, 69, 118/724, 725, 728; 269/25; 165/80.1, 80.2; 156/345

[56] References Cited

U.S. PATENT DOCUMENTS

| | | | |
|---|---|---|---|
| 4,261,762 | 4/1981 | King | 148/1.5 |
| 4,457,359 | 7/1984 | Holden | 165/80.3 |
| 4,512,391 | 4/1985 | Harra | 165/48.1 |
| 4,527,620 | 7/1985 | Pedersen et al. | 165/80.4 |
| 4,542,298 | 9/1985 | Holden | 250/443.1 |
| 4,671,204 | 6/1987 | Ballou | 118/59 |
| 4,743,570 | 5/1988 | Lamont, Jr. | 437/248 |
| 4,842,683 | 6/1989 | Cheng et al. | 156/345 |
| 4,949,783 | 8/1990 | Lakios et al. | 165/80.1 |
| 4,978,412 | 12/1990 | Aoki et al. | 156/345 |
| 4,990,047 | 2/1991 | Wagner et al. | 414/217 |
| 5,037,262 | 8/1991 | Moll et al. | 414/222 |
| 5,090,900 | 2/1992 | Rudolf et al. | 432/239 |

FOREIGN PATENT DOCUMENTS

| | | | |
|---|---|---|---|
| 0350752 | 1/1990 | European Pat. Off. | |
| 61-210176 | 9/1986 | Japan | 118/728 |
| 1-107543 | 4/1989 | Japan | 118/728 |

*Primary Examiner*—Allen J. Flanigan
*Attorney, Agent, or Firm*—John A. Frazzini

[57] ABSTRACT

A clamping ring and temperature regulated platen for clamping a wafer to the platen and regulating the temperature of the wafer. The force of the clamping ring against the wafer is produced by the weight of the clamping ring. A roof shields all but a few contact regions of the interface between the wafer and clamp from receiving depositing particles so that a coating formed on the wafer makes continuous contact with the clamping ring in only a few narrow regions that act as conductive bridges when the depositing layer is conductive.

24 Claims, 5 Drawing Sheets

PHYSICAL VAPOR DEPOSITION CLAMPING MECHANISM AND HEATER/COOLER

This patent application is a continuation of copending application Ser. No. 07/513,318 filed Apr. 20, 1990, now abandoned. This patent application also is a continuation-in-part of commonly assigned copending application Ser. No. 07/760,848 filed Sep. 17, 1991, which is a continuation of application Ser. No. 07/595,793 filed Oct. 9, 1990, now abandoned, which is a continuation of Ser. No. 07/411,189 filed Sep. 20, 1989, now abandoned, which is a continuation of Ser. No. 07/343,035 filed Apr. 25, 1989 (abandoned) which is a continuation of Ser. No. 07/185,215 filed Apr. 25, 1988 (abandoned), which is a continuation-in-part of Ser. No. 07/147,594 filed Jan. 22, 1988 (U.S. Pat. No. 4,842,683), which is a continuation of Ser. No. 06/944,843 filed Dec. 19, 1986 (abandoned).

BACKGROUND OF THE INVENTION

This invention relates in general to a wafer processing system in which the wafer is clamped to a platen and relates more particularly to such a system in which the temperature of the wafer is regulated.

In many applications, it is important to control the temperature of the wafer during processing. Excessive heating of a wafer can produce excessive diffusion of dopants within the wafer, can outgas and shrink photoresist that has been patterned to define the limits of wafer features and can segregate impurities at epitaxial interfaces. This problem is increasingly important as linewidths shrink because of the reduced tolerance for undesired diffusion and because of the large number of processing steps that must be performed without degrading the results of earlier steps. Excessive heating can result during numerous process steps including physical vapor deposition, ion implantation, ion beam milling and reactive ion etching.

Demand for high system throughput favors the use of high power ion beams in such steps, thereby producing an undesired rate of wafer heating. Batch process can reduce the amount of heating by keeping throughput high while reducing the power dissipated per wafer. However, the reduction of feature size favors the use of single wafer processing systems. In addition, for acceptable throughput, even batch processing systems can exhibit unacceptable levels of heating. It is therefore important to include in the wafer processing system a mechanism for cooling the wafer during processing.

Conversely, numerous process steps are best performed at elevated temperatures. For example, elevated temperatures are useful in implantation and diffusion steps to assist diffusion of the dopants and healing of the lattice structure. Similarly, step coverage can be improved by utilizing elevated wafer temperatures during deposition steps. It is therefore important to include in the wafer processing system a mechanism for heating the wafer during processing. In particular, such wafer heating can be used to elevate the wafer to the desired process temperature before the process step is initiated.

A number of prior systems have included heating and or cooling of the wafer during wafer processing. Early systems relied on radiative heating and cooling to regulate the temperature of the wafer. Unfortunately, silicon wafers are relatively transparent to infrared radiation and the rates of cooling and heating by radiation alone have been inadequate.

Subsequent systems clamp the wafer to a platen and regulate the wafer temperature by regulating the temperature of the platen. Unfortunately, at the microscopic level, the solid-to-solid contact between a platen and a wafer exhibits actual contact over less than 5% of the interface between the wafer and platen. This is not a significant problem at normal ambient pressures since gas molecules filling the regions between the contact points provide a significant amount of thermal conduction. Unfortunately, the wafer is typically processed at extremely low pressures so that there is only a very small contribution from the gas particles in the spaces between the solid-to-solid contact points. To improve the thermal conductivity between the wafer and the platen, one prior method utilizes a thermally conductive, pliable material between the wafer and the platen.

Unfortunately, as is indicated in U.S. Pat. No. 4,261,762 entitled *Method for Conducting Heat To Or From An Article Being Treated Under Vacuum*, issued to Monroe L. King on Apr. 14, 1981, this approach exhibits problems with repeatability, thermal nonuniformity and excessively expensive maintenance. Therefore, in this system, the wafer is clamped directly against the platen and a gas is provided to the interface between the wafer and the platen to provide gas-assisted thermal transport between these two elements. This gas is provided through a vertical channel through the platen at a pressure of about 0.5 to 2.0 Torr. The platen is cooled to remove heat from the wafer.

In U.S. Pat. No. 4,743,570 entitled *Method Of Thermal Treatment Of A Wafer In An Evacuated Environment*, issued to Lawrence T. Lamont, Jr. on May 10, 1988, the platen includes both heating and cooling mechanisms. The wafer is again held in direct contact with the platen by a set of four clamps that grip the wafer by its peripheral edge. However, because these clips are relatively flimsy, the gas pressure between the wafer and platen is limited to the range 0.1–1 Torr.

In U.S. Pat. No. 4,512,391 entitled *Apparatus For Thermal Treatment Of Semiconductor Wafers By Gas Conduction Incorporating Peripheral Gas Inlet*, issued to David J. Harra on Apr. 23, 1985, the platen includes a lip against which the wafer is held to produce, in the region between the wafer and the platen and surrounded by the lip, a first cavity within which heat is transported between the platen and wafer by a gas. Gas is provided on axis into a second cavity which is connected to the first cavity by a plurality of inlets located just inside of the lip. This structure produces a uniform gas pressure over almost the entire volume of the first cavity, thereby producing an equally uniform thermal conductance.

In U.S. Pat. No. 4,457,359 entitled *Apparatus For Gas-assisted Solid-to-solid Thermal Transfer With A Semiconductor Wafer*, issued to Scott C. Holden on Jul. 3, 1984, a spring-biased clamp presses a wafer against a domed platen with sufficient force to bend the wafer into conforming contact with the platen. A groove in the platen just inside of the region in which the wafer is clamped, supplies gas to the interface between the wafer and platen. This large amount of prestressing the wafer enables a much larger gas pressure to be produced at the wafer-clamp interface without bowing the wafer away from the platen. When the gas between the wafer and the platen is on the order of or larger than 5 Torr, gas flow is laminar so that there is no increase in thermal conductivity above this pressure.

In U.S. Pat. No. 4,542,298 entitled *Methods And Apparatus For Gas-Assisted Thermal Transfer With A Semiconductor Wafer,* issued to Scott C. Hodler on Sep. 17, 1985, the clamp and an attached bellows function as a seal between the ion bombardment chamber and a region into which gas leaks from between the wafer and the platen. This reduces the the amount of gas leakage into the ion bombardment chamber.

In U.S. Pat. No. 4,671,204 entitled *Low Compliance Seal For Gas-enhanced Wafer Cooling In Vacuum,* issued to Jon M. Ballou on Jun. 9, 1987, a new type of sealing ring is presented that produces an adequate seal between the wafer and platen without significantly stressing the wafer.

SUMMARY OF THE INVENTION

As feature size continues to decrease, it becomes more and more common to utilize single wafer processing system. The increasing use of single wafer processing systems increases the importance of using larger diameter wafers to maintain chip throughput.

For a given gas pressure between the wafer an the platen, the total force pushing the wafer away from the platen increases as the square of the diameter of the wafer. Because the gas between the wafer and the platen is generally at a pressure within the molecular flow domain, if the gas pressure is reduced to avoid bowing the wafer away from the platen, then the thermal conductivity between the wafer and platen will decrease. Thus, it is advantageous to utilize pressures that bow the wafer away from the platen even though this requires an increased clamping force to prevent the wafer from lifting away from the platen.

This increased clamping force increases the risk of breaking the wafer by excessive local clamping pressures. At such increased force, it is important to be able to determine the clamping force with significant precision so that the stress limit of the wafer is not inadvertantly exceeded. The wide variability of spring stiffness in spring-biased clamping system produces an equally large uncertainty in the actual clamping force applied to the wafer. Not only are there significant differences in spring stiffness for apparently identical springs, in addition, the stiffness of a given spring is significantly affected by the temperature of the spring and the thermal history of the spring. Especially at temperatures about 250° C., the spring stiffness varies with time. Also, a spring's stiffness varies significantly with temperature over the approximately 500° temperature range that is common in wafer processing systems.

As is illustrated in the spring-biased clamping systems of the above-discussed references by Holden and Ballou, one end of each spring is attached to the clamp and the other end is attached to a rigid spring support member. The amount of clamping pressure is determined by the distance of the wafer from this spring support member. Therefore, for a selected clamping pressure, the distance of the wafer from this support member is uniquely determined. However, there are applications in which it is useful to vary the position of the wafer within the process chamber. To provide this position variability for a selected clamping force, it would be necessary to vary the position of the spring support member. Such variability would add unwanted complexity to the clamping system.

Another problem with spring-biased clamps is that the springs are a source of particulates. As the clamping force is applied to the wafer, the compression of the spring produces flaking of material from the springs. In particular, if the springs are exposed to process gases, then surface deposits can form that will flake off when the spring is biased.

In all of the above-discussed references, the pressure of the gas between the wafer and the platen is kept low enough that the pressure does not significantly bow the wafer away from the platen. Even in those references where the wafer is bent into conformity with a domed platen, the gas pressure introduced between the wafer and the platen is selected to be on the order of or less than the wafer-platen pressure produced by conformably clamping the wafer to the platen. Within this gas pressure range, the wafer remains in contact with the platen across substantially the entire surface of the wafer.

Because the displacement of the center of the wafer from the platen is a rapidly increasing function of the wafer diameter, even for a moderate elevation of the gas pressure above this limit, wafer bowing must be taken into account in large diameter wafers such as the 8" diameter wafers now commonly being used. A platen and clamp design is therefore needed that provided uniform clamping pressure and good thermal conduction between the wafer and platen even when the pressure bows the wafer away from the platen.

In accordance with the illustrated preferred embodiment, a platen and clamp are presented that provide repeatable, constant clamping pressure of the wafer against the platen. The shape of the platen provides good thermal contact between the wafer and platen even when the pressure of gas between the wafer and platen bows the wafer away from the platen.

In this wafer processing system, a movable platen is elevated to press the wafer into the clamp. The vertical mobility of the platen enables the elevation of the wafer to be varied within the process chamber, thereby adding an extra degree of freedom in the wafer fabrication process. The wafer is loaded onto the platen and then the distance between the platen and clamp is reduced until the clamp is lifted by the platen off of a clamp support ring. The force between the clamp and the wafer is equal to the weight of the clamp and therefore is not subject to the variability that is present in spring-biased clamping systems. In the preferred embodiment, the movement of the platen relative to the clamp is achieved by movement of the platen only, but in alternate embodiments it is achieved by movement of either just the clamp or both the clamp and the platen.

Because the pressure of the clamp against the wafer is determined by the weight of the clamp, the variable clamping pressure produced by spring-biased clamping systems is eliminated. By eliminating the springs, a significant source of particulates is also eliminated. In addition, in the systems in which the platen is movable, the elevation of the wafer within the process chamber during processing can be controlled to alter processing of the wafer.

In deposition type wafer processing systems, the clamp includes a rood that shields the portion of the wafer that is in contact with the clamp. This is done to prevent deposition onto the circular region of contact between the wafer and the clamp. If this were not done, then separation of the clamp from the wafer would break the deposited coating at the clamp/wafer interface, thereby producing unwanted particulates and damage to the deposited layer. A sufficiently strong contacting would also produce enough bonding between the clamp and wafer that wafer breakage could occur when the clamp is separated from the wafer. This roof also shields the peripheral edge of the wafer from deposition, thereby avoiding the production of particulates that would form by flaking off of this peripheral edge.

It has been observed that control over the electric potential of a conductive layer that is being deposited enables improved application of this conductive layer into contact openings and vias. Therefore, for clamping rings that are to be utilized for metal deposition steps, at least one section of the clamp/wafer interface is allowed to be coated with the deposited metal layer. This produces one or more conductive bridges from the clamp to the deposited metal layer. An electric potential is applied to the clamp and, because of these conductive bridges, this potential is also applied to the metal layer being deposited. In order to avoid arching from the platen to the conductive layer being deposited, the platen is shorted to the clamping ring. The total area of these bridges is made large enough to provide the current needed to produce the desired electric potential of the depositing layer. The total area of the bridges is made small enough that, when the clamp is lifted away from the wafer, these bridges break without damaging the wafer or the deposited metal layer. In general, this is achieved for a set of six bridges, each having a width between $\frac{1}{8}$" and $\frac{3}{4}$" wide.

Around the perimeter of the platen is a lip having an inner edge elevated slightly above its outer edge so that a relatively gas-tight seal is produced between the wafer this inner edge. Just inside this inner edge is a groove that encircles the inner portion of the top surface of the platen. At least one radial groove connects this peripheral groove to a gas inlet hole near the center of the platen. This enables gas to be provided conveniently at the center of the platen and distributed by the radial groove(s) to the peripheral groove.

The gas pressure is selected to be large enough that the wafer bows away from the platen, thereby producing a shallow cavity between the wafer and the platen. However, to preserve substantially constant thermal conductivity across the surface of the wafer so that uniform heating and cooling of the wafer is effected, the gap between the platen and wafer is kept substantially constant. This is achieved by means of a dome-shaped region inside of the peripheral lip of the platen. The curvature of this dome is selected to substantially match the curvature of the wafer when the pressure of the gas between the wafer and platen is increased to a preselected maximum value.

The top of the dome-shaped region is flattened and is slightly above the height of the lip so that a sufficiently stable support of the wafer on the platen is produced as the platen lifts the wafer into the clamping ring. This avoids wobbling of the wafer that could produce lateral and/or rotational misalignment of the wafer.

One or more heater elements are attached to the back surface of the platen to enable heating of the wafer. Similarly, a tube carrying a coolant is thermally connected to the platen to enable cooling of the wafer. A gas inlet tube is attached to the hole in the center of the platen to provide gas to the shallow cavity between the wafer and plate. A temperature sensor in thermal contact with the platen provides temperature data that enables control of the wafer temperature. The current to the heater elements and the flow of cooling fluid are both controlled to produce a wafer temperature appropriate for the wafer process being implemented.

DESCRIPTION OF THE PREFERRED EMBODIMENT

In the figures, the first digit of a reference numeral indicates the first figure in which is presented the element indicated by that reference numeral.

Figure 1:
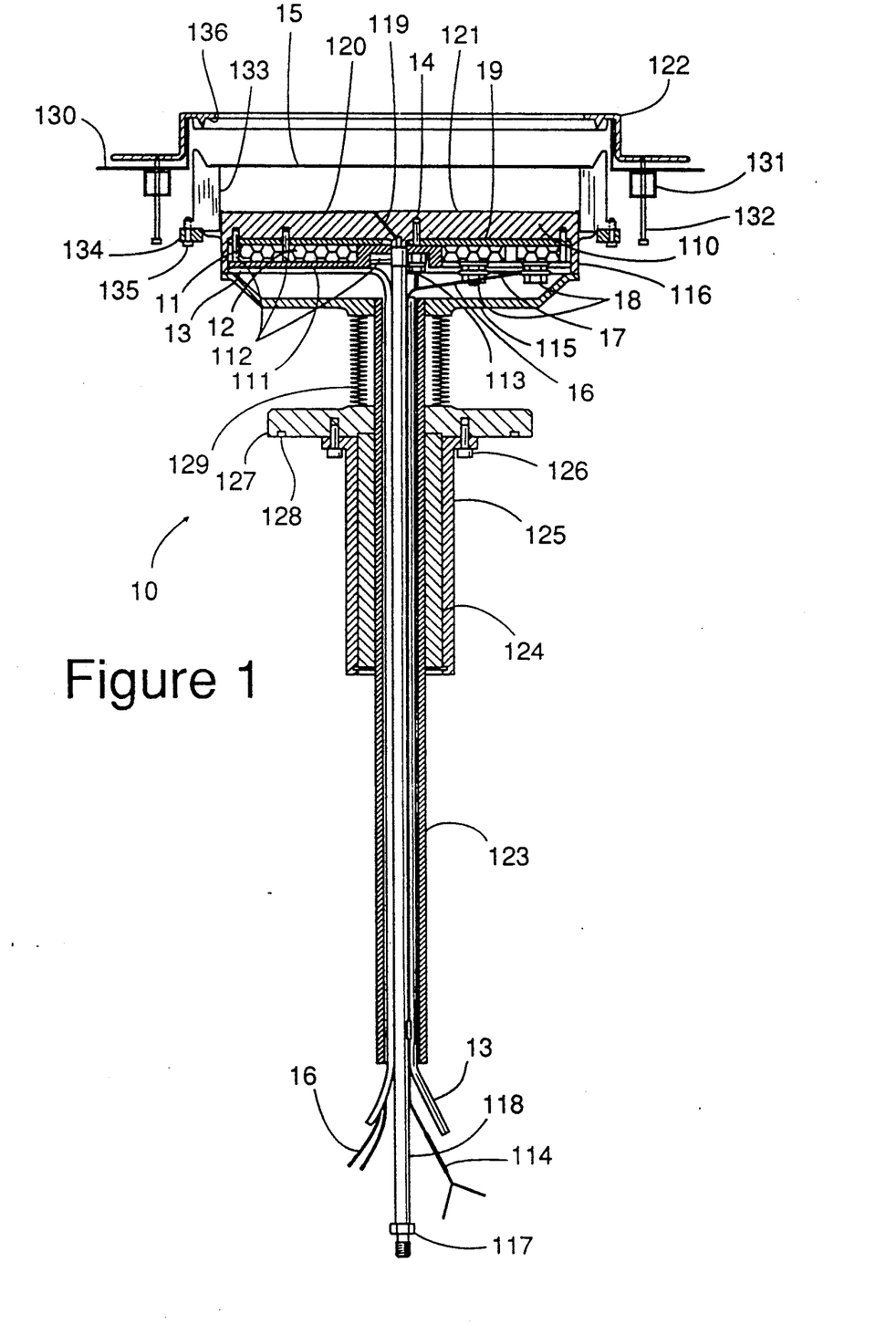
FIG. 1 is a side cross-sectional view of a wafer support assembly having heating and cooling elements to regulate the temperature of a wafer.

FIG. 1 is a side cross-sectional view of a wafer support assembly 10 having heating elements 11 and 12, a cooling tube 13 and a temperature sensor such as thermocouple 14 to regulate the temperature of a waver 15. This particular embodiment is designed to support and temperature regulate an 8" diameter wafer. In embodiments for smaller diameter wafers, the use of a single heating element 12 is sufficient to heat the wafer. The ability to heat the wafer is useful in raising the wafer temperature to any elevated temperature at which a wafer processing step would be performed. The ability to cool the wafer enables the dissipation from the wafer of excess heat supplied by such high energy processes as physical vapor deposition, ion implantation, ion beam milling and reactive ion etching. The temperature sensor, the heating and cooling elements and external control circuitry (not shown) regulate the temperature of the wafer during processing.

Electrical power of up to 1000 Watts is supplied to heating elements through electrical leads 16, busbar 17 and heater terminals 18. A cooling fluid such as water is supplied cooling tube 13 at a rate up to 2 liters/hour to extract heat from wafer support assembly 10. An upper heat distribution plate 19 of silver plated copper, in intimate contact with heating elements 11 and 12 and with a stainless steel platen 110, distributes heat uniformly from the heating elements to the platen. A lower heat distribution plate 11 conducts heat from platen 110 and heater elements to cooling tube 13. These are held in intimate contact with heating elements by screws 112. Cooling tube 13 is of stainless steel and is brazed to lower heat distribution plate 111 to produce a strong thermal coupling to this distribution plate. The thermocouple is held in intimate contact with platen 110 by means of a hollow screw 113. The electrical signal from the thermocouple is transmitted by an electrical cable 114. Elements 11-14, 16-19 and 111-114 are inclosed between platen 110 and a backing plate 115 that is welded to a tubular protrusion 116 of platen 110.

Figure 2A:
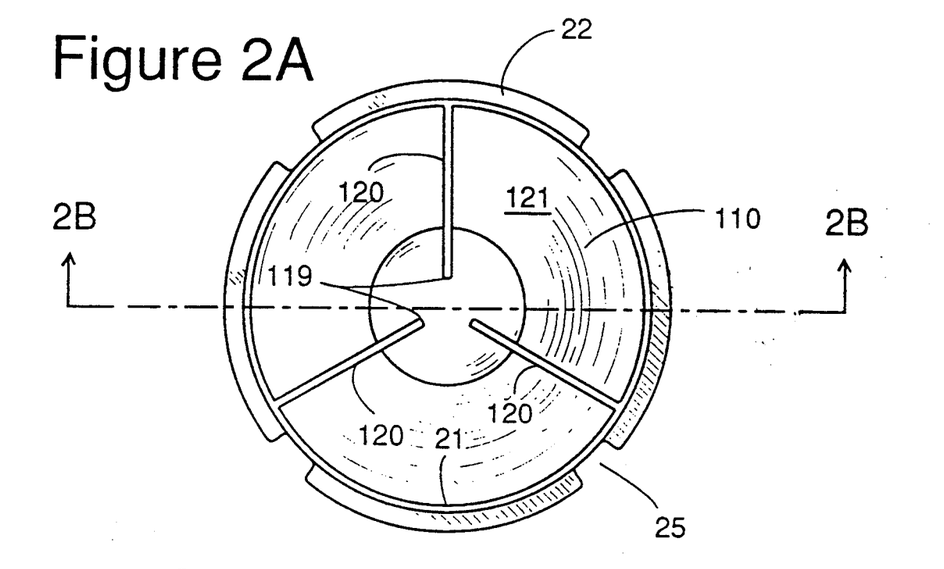
FIG. 2A is a top view of the wafer platen.

To enhance thermal coupling between wafer 15 and platen 110, a gas such as argon is supplied through a gas inlet 117 and gas supply tube 118 to a set of three cylindrical bores 119 through platen 110. Each of these bores connects to an associated radial groove 120 in a top surface 121 of the platen. These radial grooves distribute this gas from bores 119 to a circular groove 21 illustrated in FIG. 2A. This circular groove is located just inside of an annular lip 22 at the periphery of platen 110.

Figure 2B:
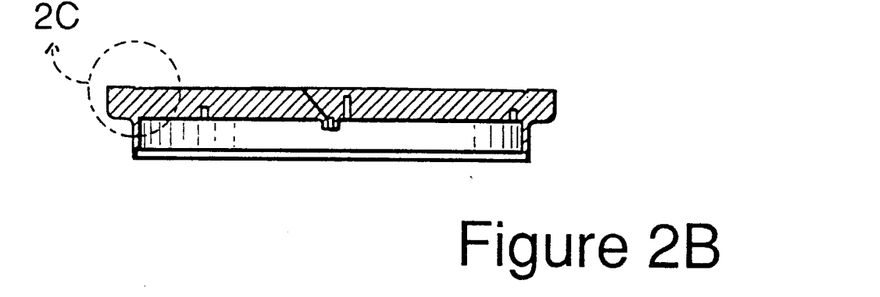
FIG. 2B is a side cross-sectional view of the wafer platen.
Figure 2C:
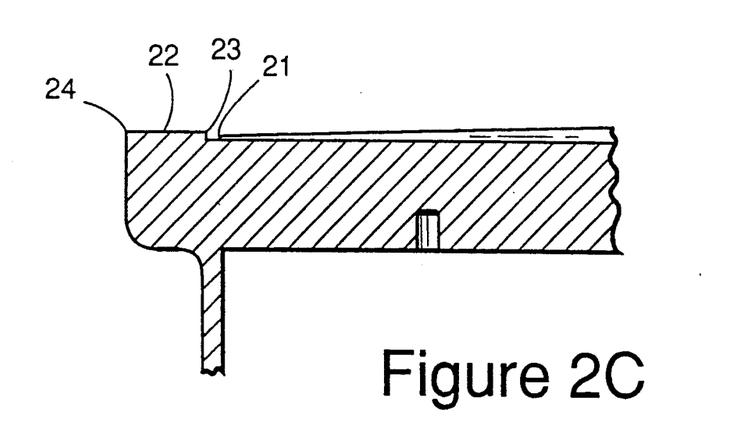
FIG. 2C is an exploded view of the lip of the wafer platen.

FIG. 2B is a side cross-sectional view of platen 110. FIG. 2C is an exploded view of lip 22 illustrating that an inner edge 23 of lip 22 is about 0.004 inches higher than the outer edge 24 of the lip so that a high pressure contact is formed between the wafer and this inner edge. This produces a solid-to-solid seal between the wafer and the platen. This seal enables a gas pressure on the order of 0.5-8 Torr to be produced between the wafer and platen by a gas flow on the order of 5-30 sccm. This pressure is sufficient to produce a sufficiently effective thermal coupling between the wafer and the platen that the wafer temperature can be regulated by the heating and cooling capabilities of the wafer support assembly.

At the microscopic level, there are voids between the wafer and inner edge 23 so that gas is able to penetrate slowly through this seal into the process chamber. However, the rate of leakage is low enough that it does not interfere with wafer processing.

A clamping ring 122 is brought into contact with the wafer to press the wafer against platen top surface 121 with a force equal tot he weight of the clamping ring. By using the weight of the clamping ring as the source of this force instead of using a spring biased clamping system as in previously discussed clamping systems, this force is accurately determined and does not vary with the temperature or thermal history of clamping springs.

In general, the clamping ring can be brought into contact with the wafer by any type of relative movement between the platen and the clamping ring. However, in this embodiment, this relative movement is produced by upward movement of the platen. By moving the platen, not only does this system enable the wafer to be brought into contact with the clamping ring, it also enables variation of the elevation of the wafer within the processing chamber during wafer processing, thereby providing an additional degree of freedom in the processing of the wafer.

To enable this vertical movement of platen, into the center of backing plate 115 is welded a tube 123 that is slidable vertically through a cylindrical bearing 124 that is mounted in a bearing housing 125. This housing is attached by bolts 126 to a flange 127 that is mounted into the bottom wall (not shown) of a wafer processing vacuum chamber. Elements 124-126 extend through a hole in the bottom of the vacuum chamber to enable electrical leads 16, electrical cable 114, cooling lines 13 and gas supply tube 118 to exit the vacuum chamber. An O-ring is held in an O-ring groove 128 in flange 127 to produce a vacuum-tight seal between the vacuum chamber wall and flange 127. A flexible metal bellows 129 is attached between backing plate 115 and flange 127 to preserve the vacuum within the vacuum chamber while enabling vertical motion of the platen. Tube 123, bearing 124 and bellows 129 prevent motion of the platen lateral to bearing 124 or rotationally about the axis of bearing 124.

When the platen is in a lowered position, the clamping ring is supported on a stationary support/shield 130. A bushing 131 and associated pin 132 extending through this bushing prevent lateral movement or rotation about a vertical axis while allowing vertical movement of the clamping ring. Pins 132 are attached to and part of the clamping ring. As the top of the platen is raised upward, the platen first comes into contact with a wafer 15 and lifts it upward into contact with clamping ring 122. Further upward movement of the platen lifts the clamping ring upward producing on the wafer a clamping force equal to the weight of the clamping ring (including the weight of pins 132).

Figure 3:
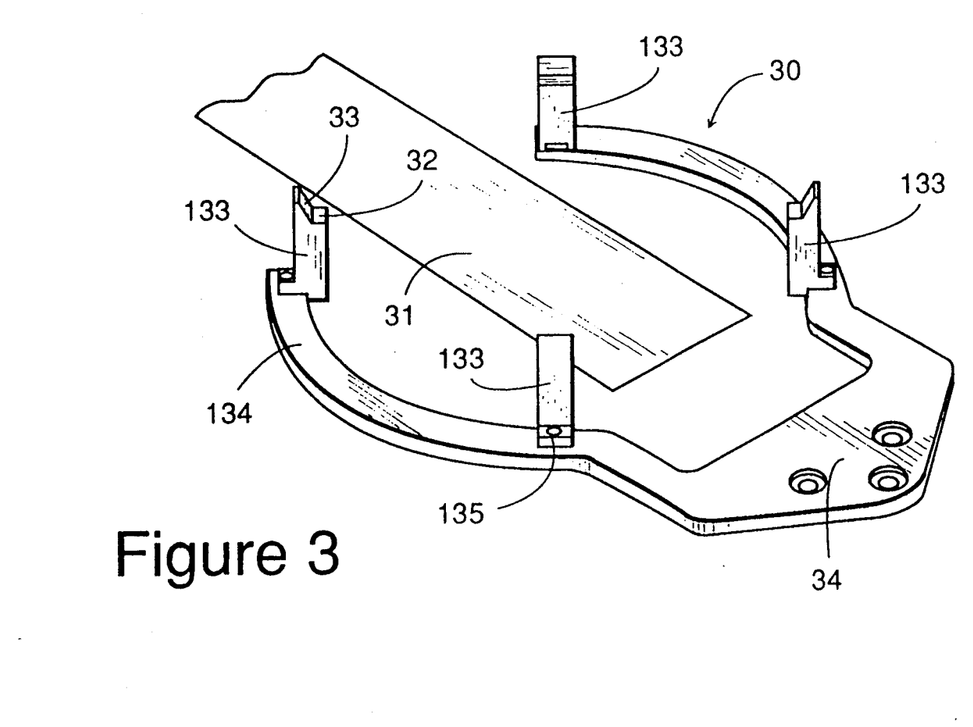
FIG. 3 illustrates the wafer transport assembly.

FIG. 3 illustrates a wafer lifting assembly 30 that is used to transport the wafer within the vacuum chamber to a point at which it can be lifted by platen 110. Wafer 15 is transported into the vacuum chamber through a wafer load lock (not shown) on a wafer transport blade 31. Wafer lifting assembly 30 is positioned beneath the wafer to lift the wafer off of the wafer blade. Wafer lifting assembly 30 includes a set of four wafer support fingers 133 that are each attached to a horseshoe shaped support ring 134 by a bolt 135. Each finger has a ledge 32 on which a portion of the wafer is supported as the wafer is lifted off of wafer transport blade 31. The shape of support ring 134 lifts the wafer lifting assembly 30 slip past the blade to lift the wafer clear of the wafer transport blade. Each finger also includes a sloping sidewall 33 that helps center the wafer onto the wafer lifting assembly. The wafer is then transported on wafer lifting assembly to the position illustrated in FIG. 1.

Figure 4A:
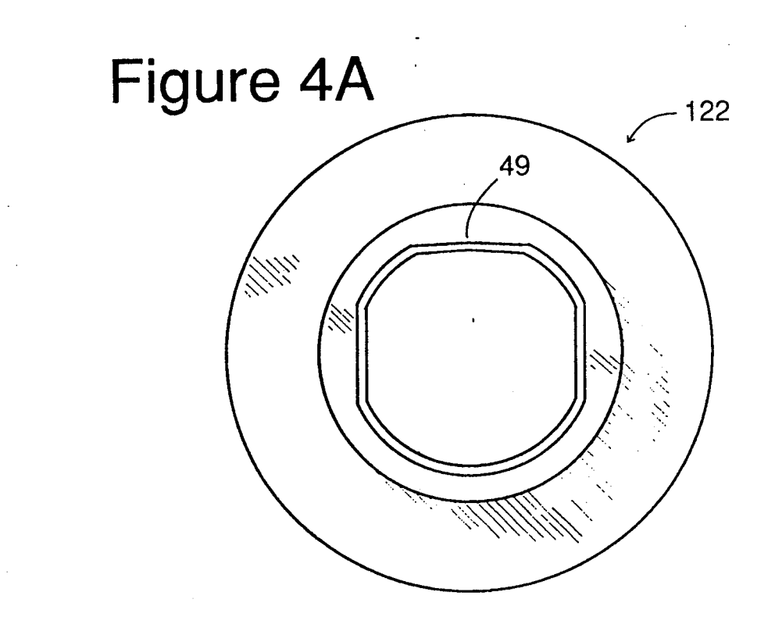
FIG. 4A is a top view of the clamping ring.
Figure 4B:
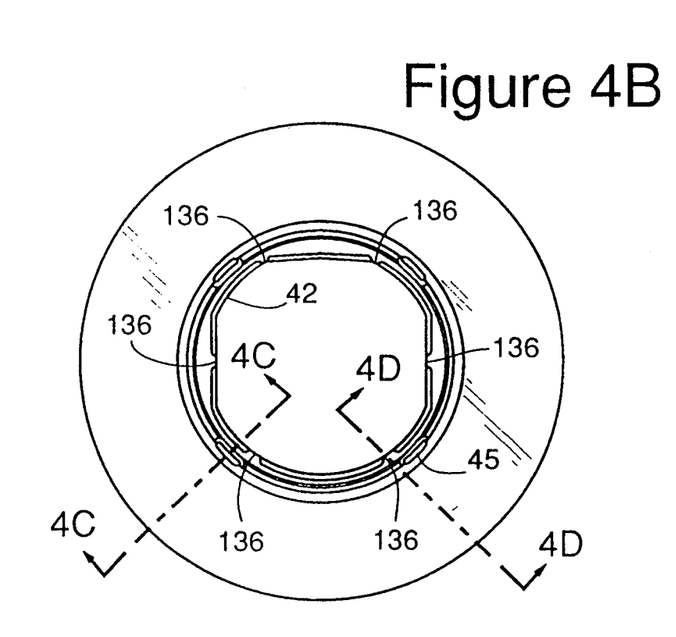
FIG. 4B is a bottom view of the clamping ring.
Figure 4C:
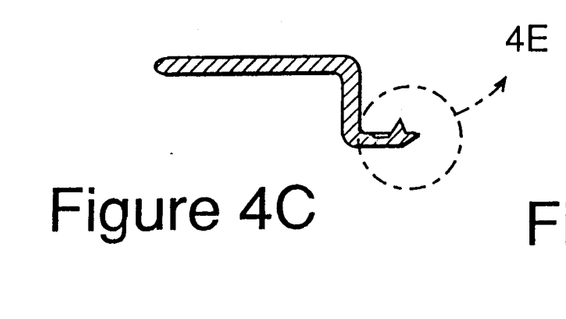
FIG. 4C is a side cross-sectional view through a portion of the clamping ring that comes into contact with the wafer lifting fingers of FIG. 3.
Figure 4D:
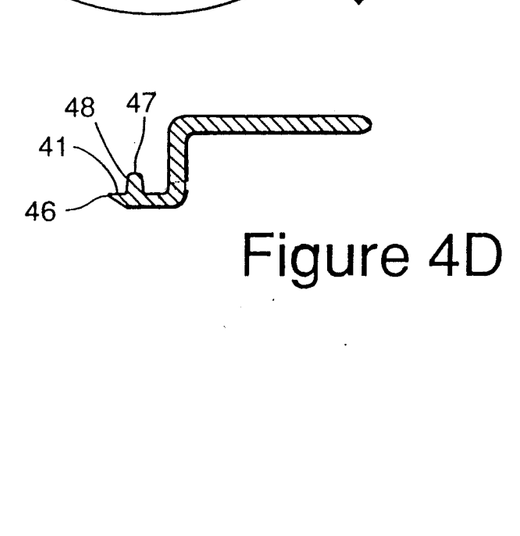
FIG. 4D is a side cross-sectional view through a portion of the clamping ring containing a contact region.

FIGS. 4A-4E illustrate the clamping ring in greater detail. FIGS. 4A and 4B are top and bottom views of clamping ring 122. FIGS. 4C and 4D are cross-sectional views of the clamping ring along the cuts indicated in FIG. 4B. The clamping ring makes contact with the wafer in six contact regions 136 that are distributed uniformly around the wafer. The cross-section of FIG. 4D passes through a contact region 136 and the cross-section of FIG. 4C passes through a region that is not a contact region and that is designed to receive the tips of lifting fingers 133 as wafer lifting assembly 30 makes contact with the clamping ring.

Figure 4E:
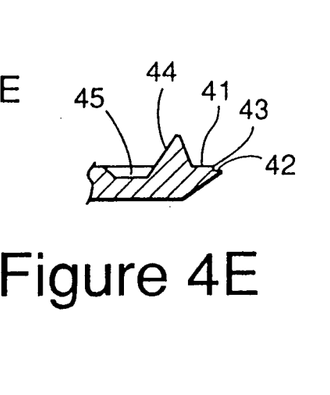
FIG. 4E is an expanded view of the tip of a contact region, illustrating the roof in the regions away from the contact region.
Figure 5:
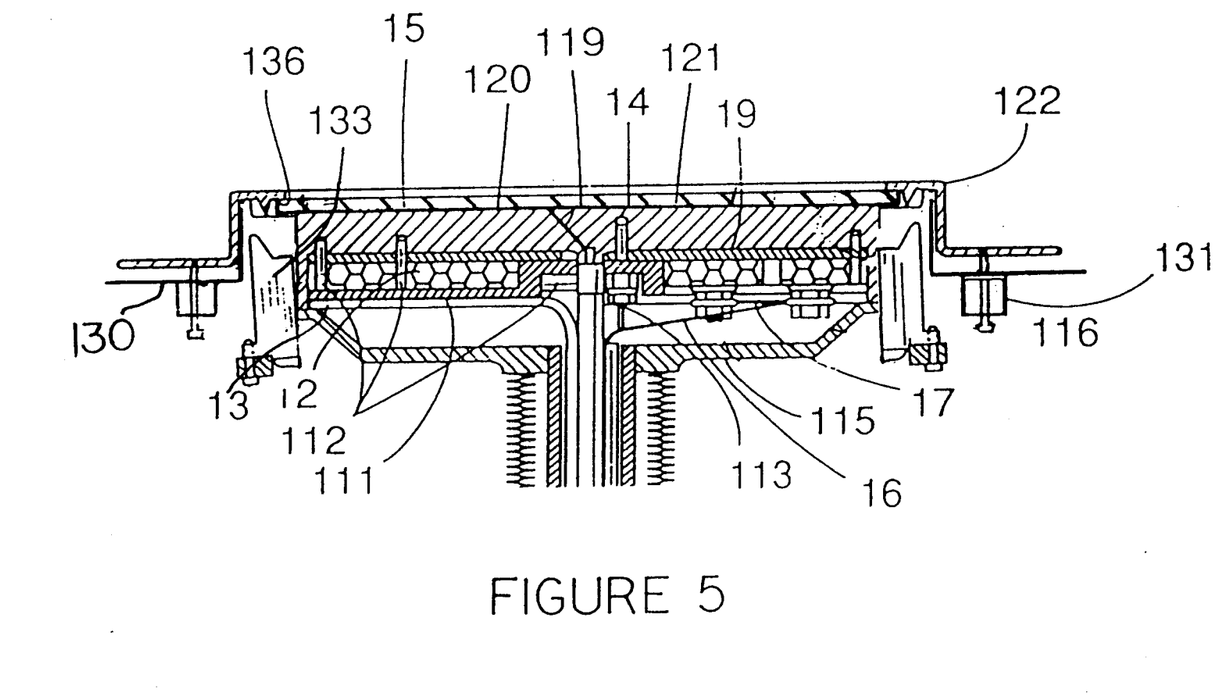
FIG. 5 illustrates this configuration of wafer 15, support fingers 33, clamping ring 122 and support/shield 130.

As is illustrated in FIGS. 4C and 4E, in a region away from contact regions 136, a surface 41 of the clamping ring makes contact with the wafer. A roof 42 extends farther over the wafer to prevent deposition onto edge 43 of the interface between the wafer and surface 41. If deposition onto the edge of this interface were allowed over a large fraction of this interface, this deposited layer could bond the clamping ring to the wafer sufficiently strongly that the wafer may not be released after processing. Even if no wafer damage results, the shearing of such a large region would produce an undesired level of particulates. Therefore, the roof shields all portions of contact edge 43 away from contact regions 136 and therefore shields approximately 80% of edge 43. The spacing between the underside of the roof and the wafer is sufficiently large (on the order of 0.02") that no continuous layer will be produced from the wafer surface to the underside of the roof.

A sloping sidewall 44 and a groove 45 are included to mate with the tip of a wafer support finger 133. As the support finger makes contact with the clamping ring, sloping sidewalls 33 and 44 come into contact and function to align clamping ring 122 with wafer lifting assembly 30. The tips of the wafer support fingers fit into grooves 45 that produce a stable coupling between the clamping ring and the wafer lifting assembly.

As is illustrated in FIG. 4D, within a contact region 136, undersurface 41 extends clear out to the inner edge 46 of the clamping ring. Therefore, in these contact regions, edge 43 of the interface between surface 41 and the wafer is not protected by a roof and therefore the depositing layer will form a continuous bridge from the wafer surface to the clamp in these contact regions This is advantageous in the case of conductive coatings because this enables the electric potential of this depositing layer to be controlled by applying a controlled voltage to the clamping ring. It has been observed that such voltage control of a depositing conductive layer can produce improved coverage of such layer into contact holes and vias in the wafer. To prevent arcing from this conductive layer to the platen top surface, the clamping ring is shorted to the platen. To minimize particulate production when the clamping ring is separated from the wafer, the circumferential lengths would be as small as possible while assuring sufficient electrical linkage across the conductive bridges to controllably bias the depositing conductive layer.

The clamping ring shields the edge of the wafer from all deposition. This is done to avoid producing on the edge of the wafer deposits that can flake off and produce particulates that interfere with wafer processing. An alignment ring 47 is included in angular portions of the clamping ring away from the contact regions 136. This alignment ring has a sloping inner surface 48 that helps center the wafer into the clamping ring. This alignment ring also prevents deposition laterally beyond this alignment ring.

This particular embodiment of clamping ring is for use with wafers having a flat formed into the edge of the wafer to identify crystal orientation. To effectively shield the wafer edge along such a flat, it is necessary that the roof include a region 49 that shields that portion of the wafer edge. In embodiments for which the wafer will not have such a flat, the roof will exhibit a circular profile when viewed from above or below.

After wafer lifting assembly 30 lifts the wafer off of the wafer transport blade, assembly 30 transports the wafer to a position as illustrated in FIG. 1. Section 34 of assembly 30 is attached to a pneumatic lift (not shown) that elevates assembly 30 vertically to lift clamping ring 122 off of support/shield 130, thereby aligning the clamping ring with the wafer supported on wafer lifting assembly 30. Tube 123 is also attached to a pneumatic lift that is now activated to lift platen 10 into contact with wafer 15 and to lift this wafer away from wafer support fingers 133. As the platen is elevated through the wafer position, fingers 133 pass through the indentations 25 in the lip of the platen. Further elevation of the platen brings the wafer into contact with clamping ring 122 and lifts this ring off of support fingers 133. When this is achieved, the clamping ring provides a clamping force equal to the weight of the clamping ring.

The top surface 121 of platen 10 is dome shaped and the weight of the clamping ring is sufficient to bend the wafer into conformity with most of surface 121 and to press the peripheral portion of the wafer into contact with inner edge 23 of lip 22. A gas pressure on the order of 0.5-8 Torr is produced at the interface between the wafer and top surface 121. This pressure is sufficient to bow the wafer away from this top surface. However, the curvature of domed top surface 121 is selected so that the gap between the wafer and surface 121 is substantially constant over the entire top surface 121. The substantial constancy of this gap and the substantial constancy of the gas pressure within the gap produces a substantially constant rate of heat transfer across the wafer.

In the central portion of domed surface 121, the platen is intentionally flattened to provide a local flat surface on which the wafer rests as it is raised into the clamping ring. This flat portion of the surface produces sufficient support to avoid the rocking of the wafer that would result if top surface 121 did not include this flattened region. Such rocking could misalign the wafer on the platen. Sufficient flatness is achieved if the inner third of top surface 121 is flattened. Because of the large radius of curvature of the domed surface compared to the lateral dimension of this top surface, only a thin layer of material needs to be removed from the top surface to flatten this region. Therefore, the gap between the wafer and platen will not be significantly altered in this region.

We claim:

1. Apparatus for processing a wafer, said apparatus comprising:
   a platen;
   a clamping ring having a weight W;
   a wafer support assembly for supporting the wafer between the platen and the clamping ring;
   means for producing an axial motion of the platen relative to the clamping ring sufficient to vary a spacing between the wafer and the clamping ring between
   (i) a first value at which said wafer can be loaded onto the wafer supporting assembly, and
   (ii) a second value at which the platen presses against a bottom side of the wafer and at which a top side of the wafer presses into the clamping ring with sufficient force to completely support the clamping ring on the wafer;
   said clamping ring pressing the wafer toward the platen with a force produced only by the weight of the clamping ring, whereby the force between the wafer and the platen is determined only by the weights of the wafer and the clamping ring and is not subjected to forces such as spring forces that can vary considerably.

2. Apparatus as in claim 1 wherein said means for producing an axial motion of the platen relative to the clamping ring comprises:
   means for elevating said platen through a range that lifts the platen into the wafer and carries it into sufficient contact with the clamping ring to support the clamping ring on the wafer.

3. Apparatus as in claim 1 further comprising:
   means for producing an axial motion of the wafer support assembly, whereby a wafer transfer device having a single degree of freedom in its motion, can position the wafer at a location at which the wafer support assembly can then lift the wafer off of this wafer transfer device, thereby enabling the use of an inexpensive wafer transfer device.

4. Apparatus as in claim 1 wherein said wafer support assembly comprises a set of wafer support fingers each having a surface for supporting the wafer.

5. Apparatus as in claim 5 wherein said wafer support fingers encircle a central space through which said platen can be elevated, said fingers each having a surface for supporting a portion of the wafer adjacent to an edge of the wafer such that said wafer is supported on these fingers, whereby a more stable support is provided for the wafer than if these fingers were located to contact the wafer away from the edge of the wafer.

6. Apparatus as in claim 1 wherein said clamping ring comprises:
a roof that does not contact the wafer and that shields at least a portion of an edge of an interface between the clamping ring and the wafer from deposition during any wafer deposition process steps.

7. Apparatus as in claim 6 wherein said clamping ring has at least one contact region that is in contact with the wafer when the clamping ring presses against the wafer and that is not protected by said roof from deposition.

8. Apparatus as in claim 7 wherein said contact regions have a width between $\frac{1}{8}''$ and $\frac{3}{4}''$.

9. Apparatus as in claim 6 wherein said roof is spaced at least 0.015" away from a plane that is coplanar with said at least one contact region.

10. Apparatus for processing a wafer, said apparatus comprising:
a platen;
a clamping ring having a weight W;
a wafer support assembly for supporting the wafer between the platen and the clamping ring;
said clamping ring pressing the wafer toward the platen with a force produced only by the weight of the clamping ring, whereby the force between the wafer and the platen is determined only by the weight of the wafer and the clamping ring and is not subjected to forces such as spring forces that can vary considerably;
wherein said wafer support has at least one sloping sidewall and wherein said clamp has at least one sloping sidewall adapted to make contact with a sloping sidewall of said wafer support to align the clamping ring with the wafer support assembly.

11. Apparatus as in claim 10 wherein said wafer support assembly comprises a plurality of wafer support fingers each having a surface for supporting the wafer and
wherein said clamping ring has a shape that defines at least one groove into which a tip of a wafer support finger can fit to provide stable alignment of the clamping ring with the wafer support assembly.

12. Apparatus for processing a wafer, said apparatus comprising:
a platen;
a clamping ring having a weight W;
said clamping ring pressing the wafer toward the platen with a force produced only by the weight of the clamping ring, whereby the force between the wafer and the platen is determined only by the weights of the wafer and the clamping ring and is not subjected to forces such as spring forces that can vary considerably; and
an alignment ring having an inner surface that slopes outward and has a ring diameter slightly larger than a wafer size for which it is designed, whereby this ring helps align the wafer with the clamping ring and prevents deposition laterally past this alignment ring.

13. Apparatus as in claim 1 further comprising:
at least one heater element that is thermally connected to the wafer platen; and
a cooling element that is thermally connected to the wafer platen.

14. Apparatus as in claim 13 wherein said platen further comprises a gas inlet connected to at least one radial groove in a top surface of said platen, said radial groove extending radially to a circular groove in this top surface near an outer perimeter of said top surface; and
a lip adjacent to an outer edge of said circular groove, said lip having an edge raised slightly above said circular groove so that, when a wafer is placed onto the top surface of the platen and said clamping ring presses the wafer toward said platen, a gas seal is produced between this edge and the wafer, thereby enabling an increased pressure of gas to form between the wafer and platen top surface.

15. Apparatus as in claim 14 wherein the top surface of the platen is domed slightly, wherein a wafer is clamped between the clamping ring and the platen and wherein a gas is present in a cavity between the wafer and the platen at a gas pressure sufficient to bow the wafer away from the platen top surface such that a substantially constant gap is produced between the wafer and the domed portion of the platen.

16. Apparatus as in claim 12 wherein the gas pressure is in the range 0.5-8 Torr.

17. Apparatus as in claim 15 wherein a central portion of the domed top surface of the platen is flat, whereby the platen has a local flat surface on which a wafer rests as it is raised into the clamping ring.

18. Apparatus for processing a wafer, said apparatus comprising:
a reactor wall enclosing a processing chamber; within this processing chamber
a platen, having an annular lip at an outer perimeter of this platen and having a domed surface encircled by this annular lip, wherein said annular lip is recessed relative to a top portion of this domed surface such that said wafer can be supported on the domed surface without making contact with the annular lip and wherein said domed surface has a flat central region, whereby a wafer can be supported on this flat surface without rocking; and
means for pressing an outer perimeter of said wafer against said annular lip to produce a substantially gas-tight seal.

19. Apparatus as in claim 18, further comprising:
a wafer in contact with the top surface of the platen and forming a substantially gas-tight seal with said lip; and
a gas in a cavity enclosed by the platen and wafer, said gas having a pressure such that the wafer is bowed away from the domed surface such that a substantially constant gap is formed between the wafer and the domed surface.

20. A platen for supporting a semiconductor substrate during vacuum processing, said platen having a top surface that is domed and has a flattened central region such that said substrate can be supported on this flattened region without rocking.

21. A platen according to claim 20 wherein said platen has a peripheral annular lip that is recessed relative to the domed surface.

22. A platen according to claim 20 wherein said platen has a means of heating and a means of cooling connected thereto.

23. A platen according to claim 22 wherein said platen has a gas inlet connected to at least one radial groove in a top surface of said platen, said radial groove extending radially to a circular groove in this top surface near an outer perimeter of said top surface, and a lip adjacent to an outer edge of said circular groove, said lip having an edge raised slightly above said circular groove so that, when a wafer is placed onto the top surface of the platen and is pressed against the platen, a gas seal is produced between the edge and the wafer, thereby allowing an increased pressure of gas to form between said wafer and said top surface of the platen.

24. A platen according to claim 20 wherein said platen is connected to a means of axial movement.

* * * * *